(12) United States Patent
Kubo

(10) Patent No.: US 6,215,726 B1
(45) Date of Patent: Apr. 10, 2001

(54) SEMICONDUCTOR DEVICE WITH INTERNAL CLOCK GENERATING CIRCUIT CAPABLE OF GENERATING INTERNAL CLOCK SIGNAL WITH SUPPRESSED EDGE-TO-EDGE JITTER

(75) Inventor: Takashi Kubo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/521,679

(22) Filed: Mar. 8, 2000

(30) Foreign Application Priority Data

Aug. 20, 1999 (JP) .................................................. 11-234036

(51) Int. Cl.⁷ .................................. G11C 8/18; H03L 7/24
(52) U.S. Cl. .................... 365/233; 365/236; 365/189.05; 365/193; 365/194; 365/195; 327/155; 327/160; 327/161; 327/162; 327/163; 327/141
(58) Field of Search .............................. 365/233, 189.05, 365/195, 194, 193, 236; 327/141, 155, 160, 161, 162, 163

(56) References Cited

U.S. PATENT DOCUMENTS 6,118,730 * 9/2000 Kubo et al. ........................... 365/233

FOREIGN PATENT DOCUMENTS 9-83358    3/1997 (JP) ............................... H03L/7/081

* cited by examiner

*Primary Examiner*—Andrew Q. Tran
(74) *Attorney, Agent, or Firm*—McDermott, Will & Emery

(57) ABSTRACT

A data/strobe output buffer performs data output according to an outputting internal dock signal DLLCLK from a DLL (Delayed Locked Loop) circuit and an output enable signal. During a time period for a data reading operation including a time period in which the output enable signal is in an active state, a control circuit suspends a phase adjusting operation of the clock signal DLLCLK in the DLL circuit. Thus, occurrence of edge-to-edge jitter in the internal clock signal defining the timing of data output can be suppressed.

17 Claims, 11 Drawing Sheets

SEMICONDUCTOR DEVICE WITH INTERNAL CLOCK GENERATING CIRCUIT CAPABLE OF GENERATING INTERNAL CLOCK SIGNAL WITH SUPPRESSED EDGE-TO-EDGE JITTER

BACKGROUND OF THE INVENTION

1. Field of the Invention

The present invention relates to a semiconductor device performing data output in synchronization with a clock signal, and particularly to a semiconductor device generating an internal clock signal for control of data output using a delayed locked loop (DLL).

2. Description of the Background Art

With recent speeding up of processing systems, high-speed data transfer between a memory and a processing device such as a processor is realized by data transfer in synchronization with a clock signal. In data reading, the processing device samples data supplied in synchronization with the clock signal. As the clock signal is sped up, however, a data valid period is shortened correspondingly, which results in extremely stringent specification for timing of data input/output. To output data accurately in synchronization with such a clock signal, a clock synchronization circuit is provided within the memory to generate an internal clock signal in synchronization with an external clock signal for use in the data input/output. Here, a delayed locked loop (DLL) circuit is used to generate such an internal clock.

FIG. 18 is a diagram schematically showing a configuration of a main portion of a conventional semiconductor device incorporating an internal clock generating circuit. The semiconductor device 1 shown in FIG. 18 includes: an input buffer 11 for buffering an external clock signal Ext.CLK to generate an internal clock signal CLKIN; a DLL circuit 10 for generating an outputting internal clock signal CLKO in synchronization with external clock signal Ext.CLK; a data output circuit 20 for transferring data DATA transferred from an internal circuit (not shown) according to outputting clock signal CLKO from DLL circuit 10; and an output buffer 22 for buffering data transferred from data output circuit 20 for output as external data DOUT.

DLL circuit 10 includes: a variable delay line 12 for delaying internal clock signal CLKIN from input buffer 11 to generate outputting internal clock signal CLKO; an I/O replica circuit 13 for delaying outputting internal clock signal CLKO from variable delay line 12 by a prescribed time; a phase comparator 14 for comparing phases of a clock signal Int.CLK from I/O replica circuit 13 and internal clock signal CLKIN from input buffer 11; an up/down counter 15 for performing a counting operation according to an up designating signal UP and a down designating signal DOWN from phase comparator 14; and a decoder 16 for decoding a count value of up/down counter 15 to determine a delay amount of variable delay line 12.

I/O replica circuit 13 adds to outputting internal clock signal CLKO, a delay time that is equivalent to a sum of delay times of input buffer 11 and output buffer 22. Now, an operation of semiconductor device 1 shown in FIG. 18 will be described with reference to a timing chart shown in FIG. 19.

External clock signal Ext.CLK has a cycle time of tCK. With input buffer 11 having a delay time Di, internal clock signal CLKIN changes behind external clock signal Ext.CLK by delay time Di. I/O replica circuit 13 has a delay time Di+Do, which is the sum of delay time Di of input buffer 11 and a delay time Do of output buffer 22. Phase comparator 14 compares the phase of internal clock signal Int.CLK from I/O replica circuit 13 and the phase of internal clock signal CLKIN from input buffer 11 and, according to the phase difference, activates up designating signal UP or down designating signal DOWN.

Up/down counter 15 increments/decrements its count value according to designating signals UP and DOWN from phase comparator 14. Decoder 16 decodes the count value of up/down counter 15, and sets the delay amount of variable delay line 12 corresponding to the count value of up/down counter 15. Repeating the above-described operations results in matching in phases of internal clock signals CLKIN and Int.CLK with each other in the accuracy of at most a unit amount of delay of variable delay. line 12.

In the case where variable delay line 12 has a delay time Dd, outputting internal clock signal CLKO from variable delay line 12 changes with delay of Di+Dd relative to external clock signal Ext.CLK. In a data output mode, data output circuit 20 transfers internal data DATA in synchronization with this outputting internal clock signal CLKO. Output buffer 22 is activated in the data output mode, and generates and outputs external data DOUT from the data output from data output circuit 20.

Internal clock signal Int.CLK from I/O replica circuit 13 changes behind outputting internal clock signal CLKO by time Do+Di. Data output circuit 20 transmits data in synchronization with outputting internal clock signal CLKO, and output buffer 22 outputs external data DOUT after delay time Do. Thus, external output data DOUT is output with delay time Do behind clock signal CLKO. In other words, external data DOUT changes behind external clock signal Ext.CLK after a lapse of Di+Dd+Do. This time Di+Dd+Do equals one cycle period of external clock signal Ext.CLK. External data DOUT is thus output in synchronization with the change of external clock signal Ext.CLK.

In the data output operation as shown in FIG. 19, data are output in synchronization with rising and falling edges of external clock signal Ext.CLK. That is, data are output in a double data rate (DDR) mode. Utilizing I/O replica circuit 13 enables external data DOUT to be output in phase-synchronization with external dock signal Ext.CLK, in the accuracy of at most a unit delay amount of variable delay line 12.

The processor performs taking-in of data supplied in synchronization with a data strobe signal (not shown) that is applied in parallel with external data DOUT. Therefore, the data strobe signal and external data DOUT are both in synchronization with external clock signal Ext.CLK, and thus, the external processor can take in (sample) data accurately. It is thus possible to perform accurate data transmission utilizing a high-speed clock signal.

If data output is performed using an internal clock generating circuit such as a DLL circuit, the most important parameter that should be taken into careful consideration is an edge-to-edge jitter. The edge-to-edge jitter is a jitter of a data valid period (data valid window) relative to an edge of an external clock signal. In the case where a data strobe signal (that is in synchronization with outputting internal clock signal CLKO from the DLL circuit) has a delay time A relative to external clock signal Ext.CLK as shown in FIG. 20, for example, DLL circuit 10 shown in FIG. 18 performs phase adjustment. If this phase adjusting operation is performed in a time period during which external clock signal Ext.CLK is at an H level (time tCH) and the phase of this data strobe or outputting internal clock signal CLKO leads by time B that of external clock signal Ext.CLK, then the valid window of output data D1 becomes narrower by (A+B) than the time period tCH during which external clock signal Ext.CLK is at the H level. If the phase of this data strobe or outputting internal clock signal CLKO is not adjusted until the next edge of external clock signal Ext.CLK (i.e., if the delay amount of DLL circuit is not adjusted), then the data strobe rises earlier than external clock signal Ext.CLK by time B. Therefore, the edge-to-edge jitter in this case is (B−B=0), and the valid window width of data D2 at this time falls in the time period during which external clock signal Ext.CLK is at an L level. In the case of external clock signal Ext.CLK with duty ratio of 50%, the valid window period of data D2 becomes time tCH.

The processor performs data sampling by shifting the phase of the data strobe by 90°, for example. Therefore, if the valid window of output data is narrowed, it becomes difficult to secure adequate data set-up/hold time for this sampling period, which hinders accurate data sampling.

The effect of the narrowed data valid window due to the edge-to-edge jitter is serious especially in the case where external clock signal Ext.CLK is a high-speed clock signal having the time tCH short. This results in a problem that data cannot be transferred according to a high-speed clock.

One way to minimize the edge-to-edge jitter is to increase the accuracy of phase adjustment of the DLL circuit. This can be done by shortening a unit time of delay amount of the DLL circuit, or the time A shown in FIG. 20. To shorten the delay unit time of DLL circuit, however, it is necessary to increase the number of delay stages of variable delay line 12 so as to decrease the unit delay amount, or it is necessary to increase the number of bits to be counted by up/down counter 15 so as to decrease an operating current adjusting amount of inverters forming variable delay line 12. This results in an increased area occupied by the circuitry.

To decrease the unit delay amount, it is necessary to reduce the effect of variation of operating environment of the DLL circuit as much as possible. This leads to complicated circuit configuration. It is also necessary to accomplish a configuration that allows stabilization of an operating power supply voltage to maintain an accurately set delay amount even when the power supply voltage fluctuates. This not only complicates the circuit configuration but also increases the area occupied by the circuit.

SUMMARY OF THE INVENTION

An object of the present invention is to provide a semiconductor device which reliably suppresses an edge-to-edge jitter without increasing an area occupied by an internal clock generating circuit and complexity of the circuit configuration.

Another object of the present invention is to provide a semiconductor device which permits high-speed data transfer, suppressing the edge-to-edge jitter.

The semiconductor device according to a first aspect of the present invention includes an internal clock generating circuit for receiving a first clock signal corresponding to an external clock signal to generate a second clock signal in synchronization with the fist clock signal. This internal clock generating circuit includes a circuit for detecting phase difference between the first and second clock signals to adjust the phase of the second clock signal based on the detection result.

The semiconductor device according to the first aspect further includes: an output circuit activated in a data output mode for externally outputting data in synchronization with the second clock signal; and a clock control circuit for suspending the phase adjusting operation of the phase adjusting circuit in the data output mode, at least during a time period in which the output circuit is activated.

The semiconductor device according to a second aspect of the present invention includes a clock generating circuit for generating a second clock signal in synchronization with a first clock signal, according to the first clock signal that is equivalent to an externally supplied dock signal. The clock generating circuit includes a circuit for detecting a phase difference of the first and second dock signals to adjust the phase of the second dock signal based on the detection result.

The semiconductor device according to the second aspect further includes: an internal circuit operating in synchronization with the second clock signal; and a clock control circuit for activating the phase adjusting operation of the phase adjusting circuit within the clock generating circuit at a prescribed period.

As the phase adjusting operation is suspended in the data output operation, the phase of the second clock signal causing the output circuit to operate does not change, which suppresses an edge-to-edge jitter. It is thus possible to keep the widths of data valid windows constant.

Furthermore, the clock generating circuit is activated only for a necessary time period at prescribed intervals. Thus, the number of times of phase adjusting operation of the clock generating circuit can be decreased, and it becomes possible to suppress frequency of occurrence of the edge-to-edge jitter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
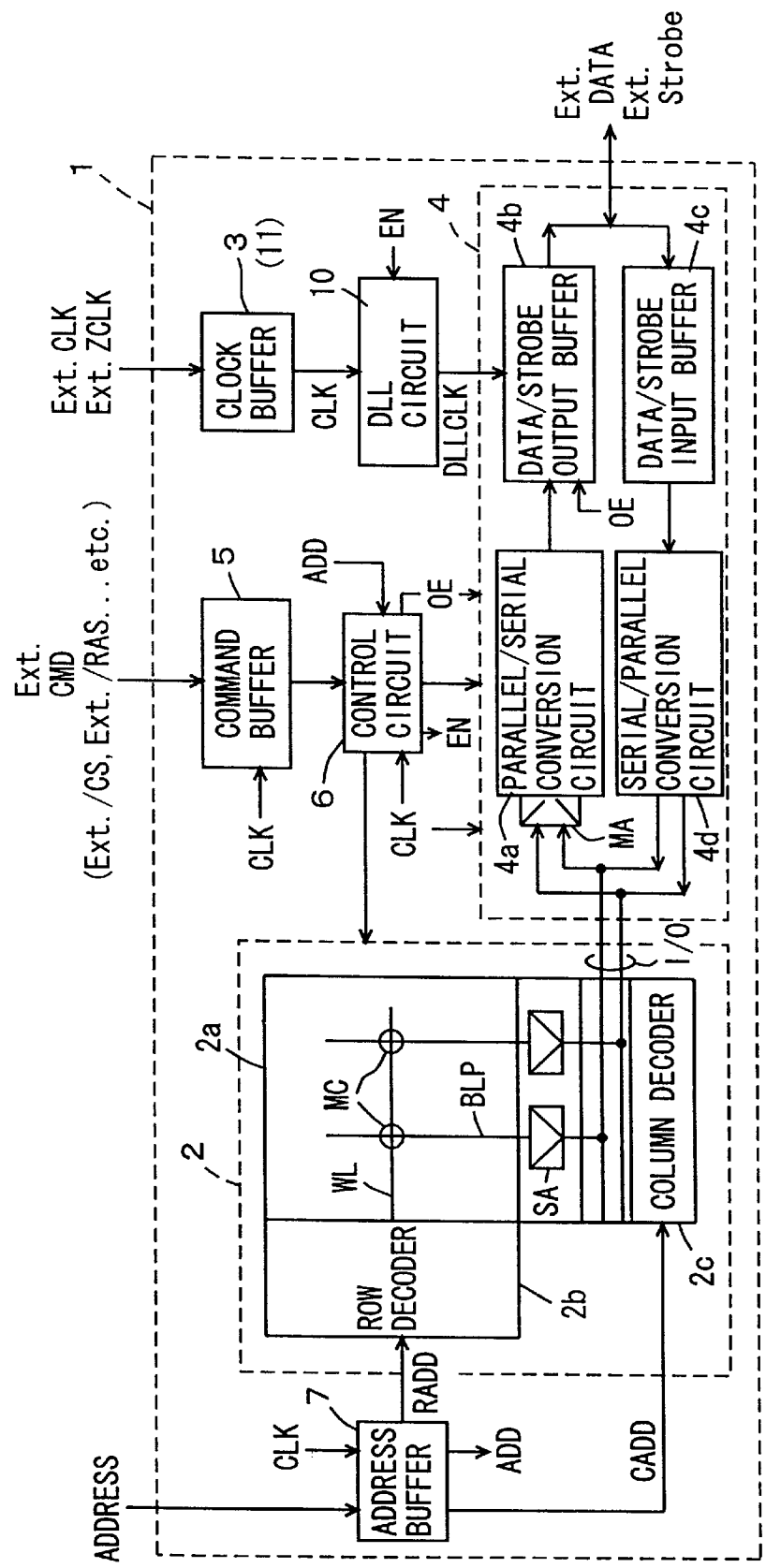
FIG. 1 is a diagram schematically showing an entire configuration of a semiconductor device according to the present invention.

FIG. 1 is a diagram schematically showing a configuration of a main portion of a semiconductor device 1 according to the first embodiment of the present invention. The semiconductor device 1 shown in FIG. 1 includes: a memory array circuit 2 having memory cells MC; a clock buffer 3 for buffering external complementing clock signals Ext.CLK and Ext. ZCLK to generate an internal clock signal CLK; a DLL circuit 10 for generating an output clock signal DLLCLK according to internal clock signal CLK from dock buffer 3; an input/output circuit 4 for performing at least data output according to internal clock signal DLLCLK from DLL circuit 10; and an address buffer 7 for taking in an externally supplied address signal in synchronization with internal clock signal CLK from clock buffer 3 to generate an internal row address RADD, an internal column address CADD, and a bank address or an address ADD for a specific command.

Figure 18:
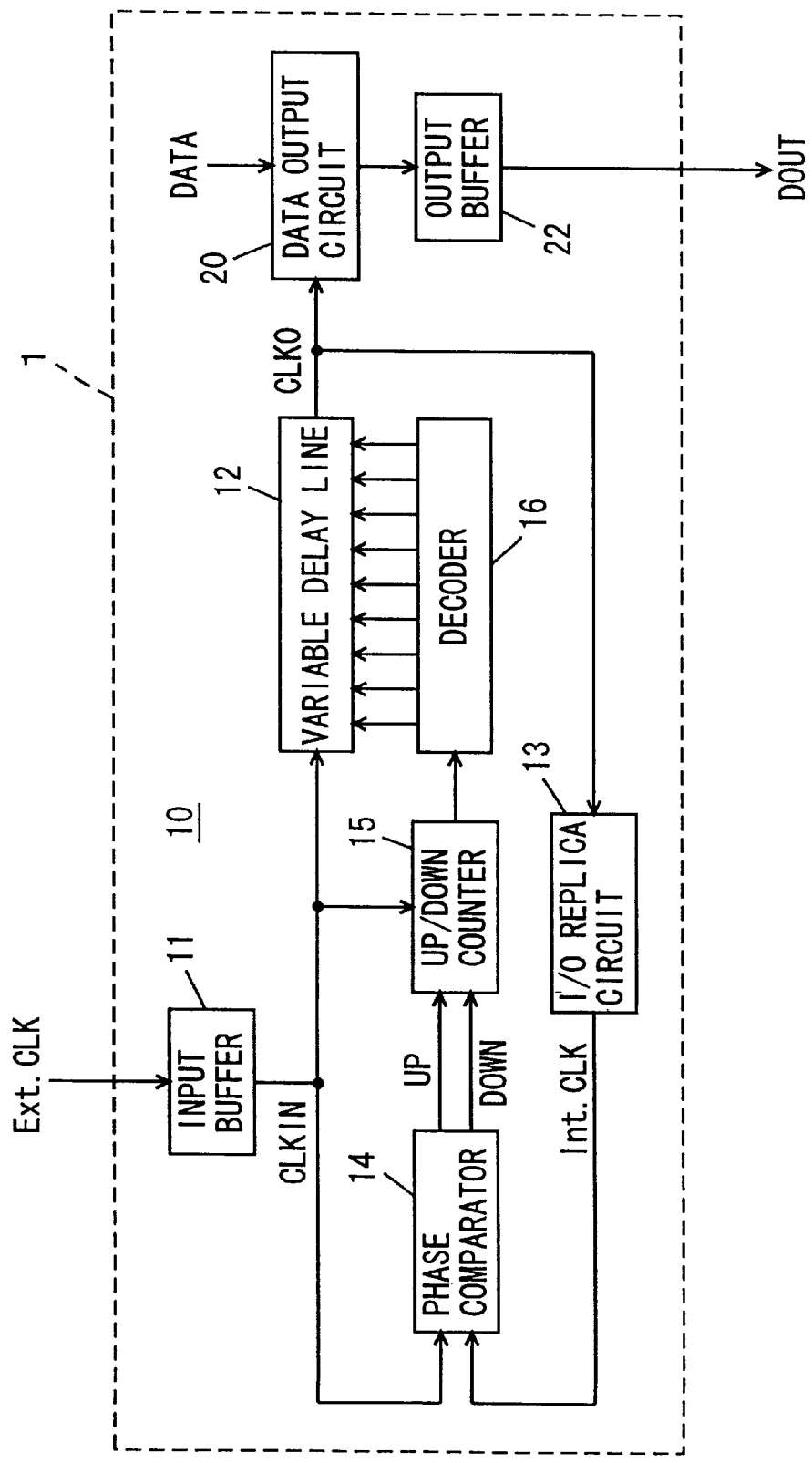
FIG. 18 is a diagram schematically showing a configuration of a data output portion of a conventional semiconductor device.
Figure 19:
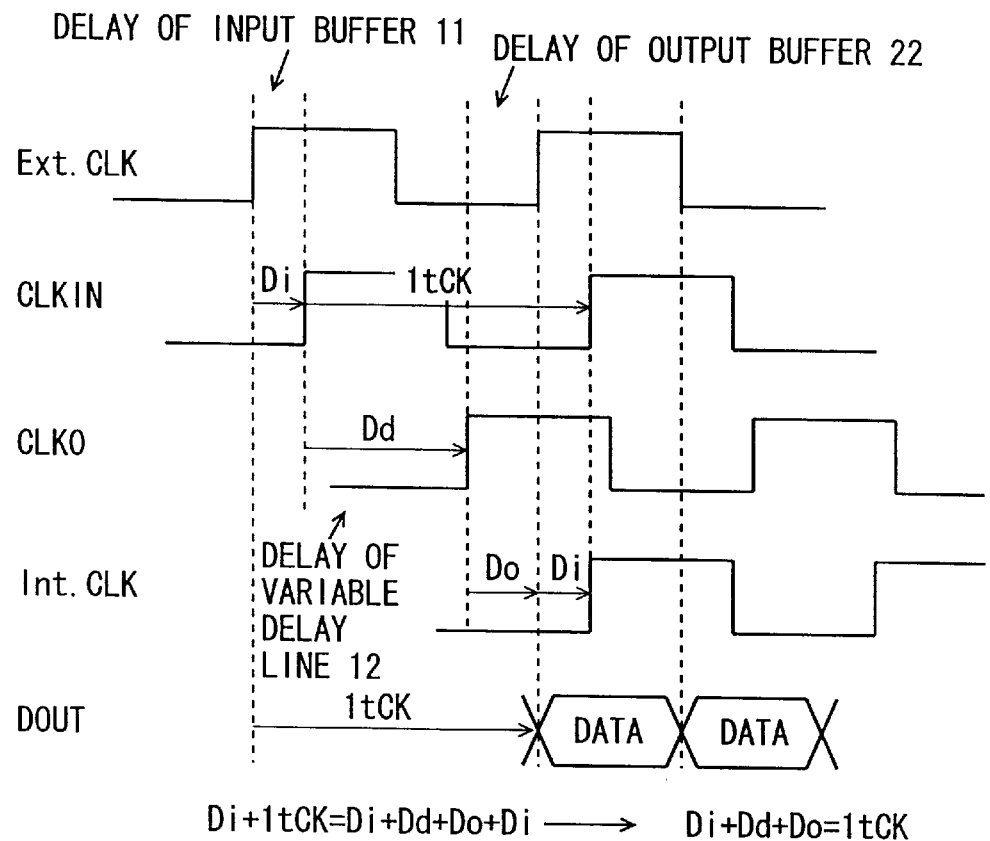
FIG. 19 is a timing chart representing an operation of the semiconductor device shown in FIG. 18.
Figure 20:
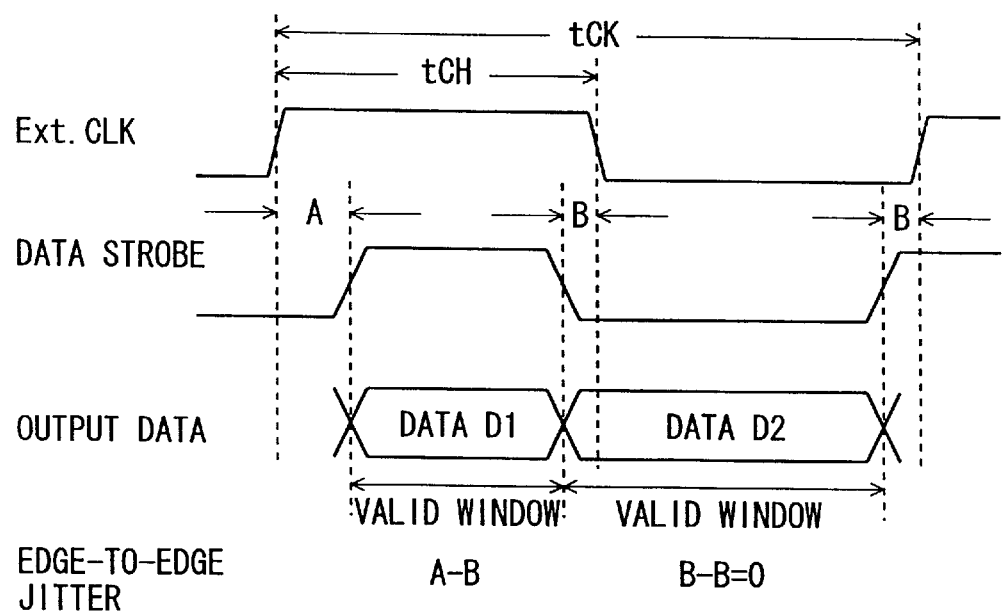
FIG. 20 is a diagram illustrating variation in data valid windows of the conventional semiconductor device.

Clock buffer 3 shown in FIG. 1, which is equivalent to clock buffer 11 shown in FIG. 18, detects crossing points of external dock signals Ext.CLK and Ext.ZCLK that are complementary to each other, and generates internal dock signal CLK in synchronization with these crossing points. Clock buffer 3 is formed, for example, of a differential amplifier.

In DLL circuit 10, a phase adjusting operation is activated according to an activation control signal EN that is inactivated at least during a time period when an output enable signal OE is in an active state. DLL circuit 10 generates internal clock signal DLLCLK in synchronization with internal clock signal CLK. The configuration of DLL circuit 10 is substantially the same as that shown in FIG. 18, except that the phase adjusting operation of DLL circuit 10 is selectively activated.

Memory array circuit 2 includes: a memory cell array 2a including a plurality of memory cells MC arranged in rows and columns, word lines WL disposed corresponding to respective rows of memory cells MC, and bit line pairs BLP disposed corresponding to respective columns of memory cells MC; a row decoder 2b for driving a word line corresponding to an addressed row in memory cell array 2a to a selected state according to a row address signal RADD from address buffer 7; a sense amplifier SA provided corresponding to a respective bit line pair BLP for differentially amplifying and latching a potential of a corresponding bit line pair when activated; and a column decoder 2c for performing column selection according to a column address signal CADD from address buffer 7 to generate a column select signal for coupling bit line pair BLP (or sense amplifier SA) corresponding to a selected column to an internal data line I/O.

In memory array circuit 2, a column select gate is provided between sense amplifier SA and internal data line I/O, and connects a corresponding bit line pair or sense amplifier to the internal data line according to the column select signal from column decoder 2c. This gate is not shown in the figure for simplicity.

Data input/output circuit 4 includes: a main amplifier circuit MA activated in the data output mode for amplifying data of a plurality of bits read out onto internal data lines I/O; a parallel/serial conversion circuit 4a for taking in data, in parallel, from main amplifier circuit MA and outputting the data, in series, in synchronization with clock signal CLK; a data/strobe output buffer 4b activated when output enable signal OE is activated, for buffering data read out from parallel/serial conversion circuit 4a and a strobe signal (not shown) to output external data Ext.DATA and external strobe Ext.Strobe; a data/strobe input buffer 4c for taking in externally supplied data according to the data strobe signal in the data input mode; and a serial/parallel conversion circuit 4d for taking in internal data supplied from data/strobe input buffer 4c in synchronization with clock signal CLK at the time of data writing, and transmitting the data in parallel onto internal data lines I/O.

In the data writing operation, data/strobe input buffer 4c takes in external data according to the data strobe supplied from an external processor. Utilizing parallel/serial conversion circuit 4a and serial/parallel conversion circuit 4d, it becomes possible to cause memory array circuit 2 of semiconductor device 1 to operate in synchronization with internal clock signal CLK, and externally, it becomes possible to perform data transfer in synchronization with rising and falling edges of external clock signal Ext.CLK.

Semiconductor device 1 further includes: a command buffer 5 for taking in an externally supplied command CMD designating an operating mode in synchronization with clock signal CLK; and a control circuit 6 for receiving the internal command from command buffer 5 and specific address signal ADD from address buffer 7 to perform control necessary for carrying out the designated operating mode in synchronization with internal clock signal CLK.

Command CMD supplied to command buffer 5 designates an operating mode in accordance with a combination of states of a plurality of external control signals including an external chip select signal Ext./CS, an external row address strobe signal Ext./RAS . . . , at a rising edge of dock signal CLK. The external control signals may further include, for example, an external write enable signal Ext./WE and an external column address strobe signal Ext./CAS.

Address signal ADD is provided to control circuit 6 so that a specific address bit can be utilized as a part of a command. When address signal ADD includes a bank designating signal, control circuit 6 controls an operating mode of the designated bank. That is, when memory array circuit 2 has a plurality of banks, control circuit 6 causes only the bank addressed by the bank address signal to perform a designated operation.

In the case where address signal ADD is utilized as a part of the command, control circuit 6 decodes an internal command from command buffer 5 and a specific bit of address signal ADD, and performs control necessary for carrying out the operating mode designated according to the decoding result.

Figure 2:
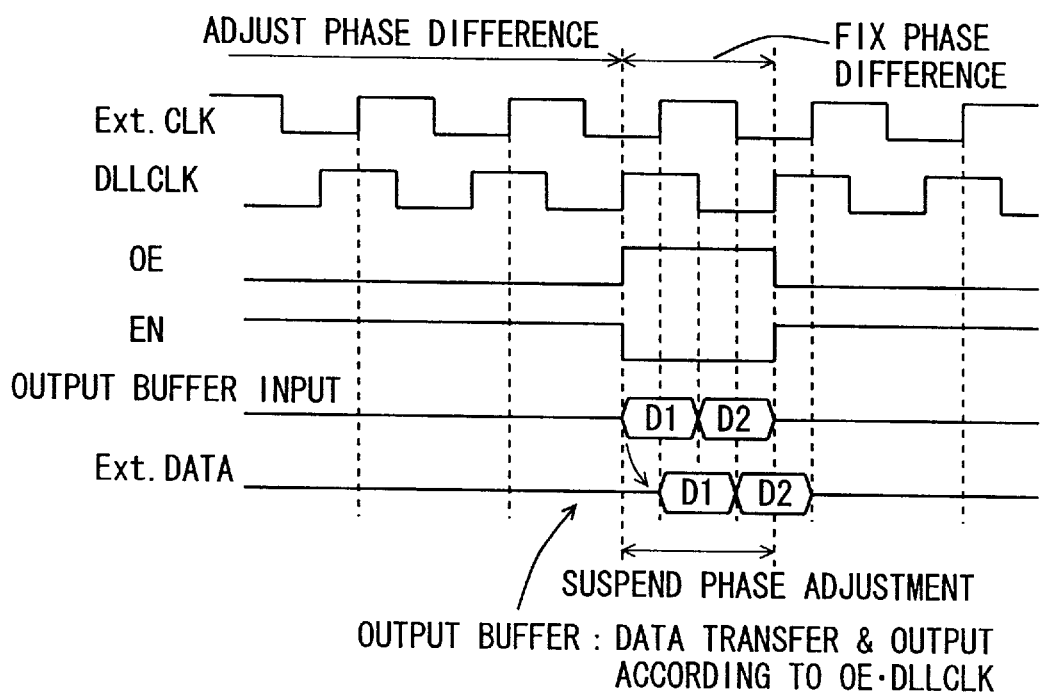
FIG. 2 is a timing chart representing an operation of the semiconductor device shown in FIG. 1.

In semiconductor device 1 shown in FIG. 1, DLL circuit 10 suspends the phase adjusting operation on outputting clock signal DLLCLK during the time period in which output enable signal OE is in an active state and data are output from data/strobe output buffer 4b according to outputting clock signal DLLCLK, as illustrated in the timing chart of FIG. 2. Therefore, an edge-to-edge jitter is not generated while data are output from data/strobe output buffer 4b (as the delay time of outputting clock signal DLLCLK relative to external clock signal Ext.CLK remains unchanged during the data output operation). Accordingly, it is possible to guarantee an equal valid window width for every output data, and thus, data can be transferred at high speed.

The external processor performs sampling of received data, according to the data strobe output from data/strobe output buffer 4b. Therefore, the external processor can perform taking-in (sampling) of the received data accurately even when the phase of external data Ext.DATA is offset relative to external clock signal Ext.CLK.

Figure 3:
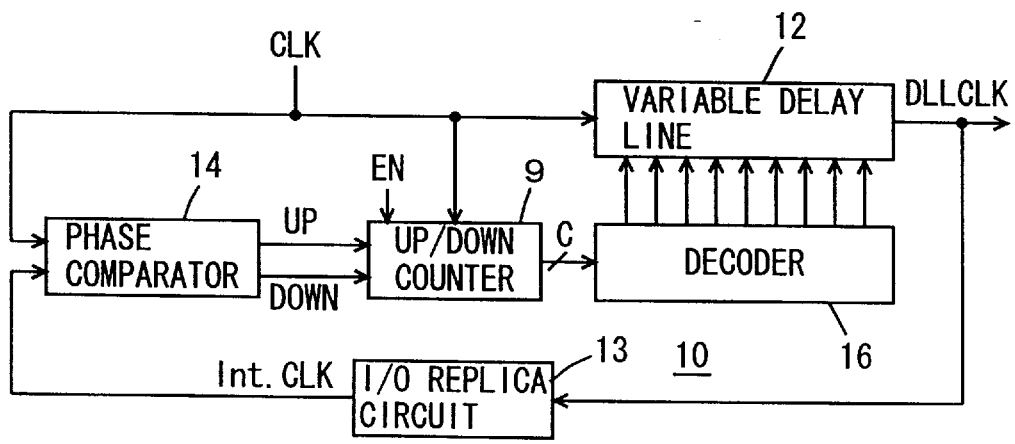
FIG. 3 is a diagram schematically showing a configuration of a DLL circuit shown in FIG. 1.

FIG. 3 is a diagram schematically showing a configuration of DLL circuit 10 shown in FIG. 1. DLL circuit 10 shown in FIG. 3 includes: a phase comparator 14 for comparing phases of clock signal CLK from clock buffer 3 and internal clock signal Int.CLK from I/O replica circuit 13; an up/down counter 9 activated when activation control signal EN is activated, for performing a counting operation according to up designating signal UP and down designating signal DOWN from phase comparator 14; a decoder 16 for decoding a multibit count C from up/down counter 9; and a variable delay line 12 with a delay amount determined by an output signal of decoder 16, for delaying clock signal CLK to generate outputting internal clock signal DLLCLK.

I/O replica circuit 13 is formed, for example, of an interconnection line delay circuit or a buffer circuit. I/O replica circuit 13 provides a delay time that is equal to a sum of delay at clock buffer 3 and delay at data/strobe output buffer 4.

Phase comparator 14 may be any one of an exclusive-OR type phase comparator, a phase-frequency-comparator type (PFC) phase comparator, and an RS flip-flop type phase comparator.

Variable delay line 12 is formed of an even number of stages of inverters. An operating current of this even number of stages of inverters or the number of stages of the inverters is adjusted according to the output signal of decoder 16. The adjustment of the operating current is performed utilizing, for example, a current mirror circuit. A mirror current of a current flowing through the current mirror circuit is used as the operating current of the even number of stages of inverters, and the current flowing through the current mirror circuit is altered dependent on the output signal of decoder 16.

Figure 4:
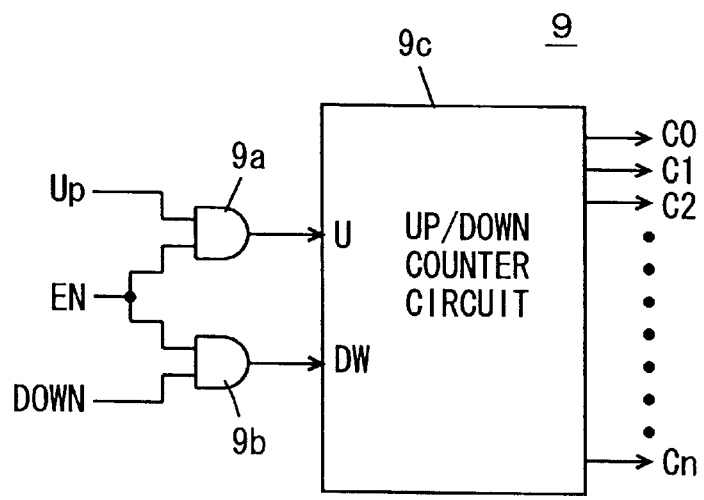
FIG. 4 is a diagram schematically showing a configuration of an up/down counter shown in FIG. 3.

FIG. 4 is a diagram schematically showing a configuration of up/down counter 9 shown in FIG. 3. Referring to FIG. 4, up/down counter 9 includes: an AND circuit 9a receiving up designating signal UP and activation control signal EN; an AND circuit 9b receiving activation control signal EN and down designating signal DOWN; and an up/down counter circuit 9c receiving an output signal of AND circuit 9a at its up input U and an output signal of AND circuit 9b at its down input DW for performing a counting operation to generate a count value of C0 to Cn.

When activation control signal EN is in an inactive state at an L level, the output signals of AND circuits 9a and 9b are both at an L level. Up input U and down input DW of up/down counter circuit 9 are both fixed at the L level, whereby no counting operation is performed.

When activation control signal EN is at an H level, the output signals of AND circuits 9a and 9b both change according to up designating signal UP and down designating signal DOWN, respectively. Up/down counter 9c performs increment/decrement of the count value in accordance with signal supplied to up input U and down input DW.

Thus, by setting activation control signal EN to an inactive state at the time of data output, the count value of C0 to Cn from up/down counter circuit 9c is preserved, and the delay amount of variable delay line 12 is held as it was before the inactivation of activation control signal EN. Accordingly, data output is performed with the delay time phase) of outputting internal clock signal DLLCLK fixed, whereby occurrence of the edge-to-edge jitter is suppressed.

Figure 5:
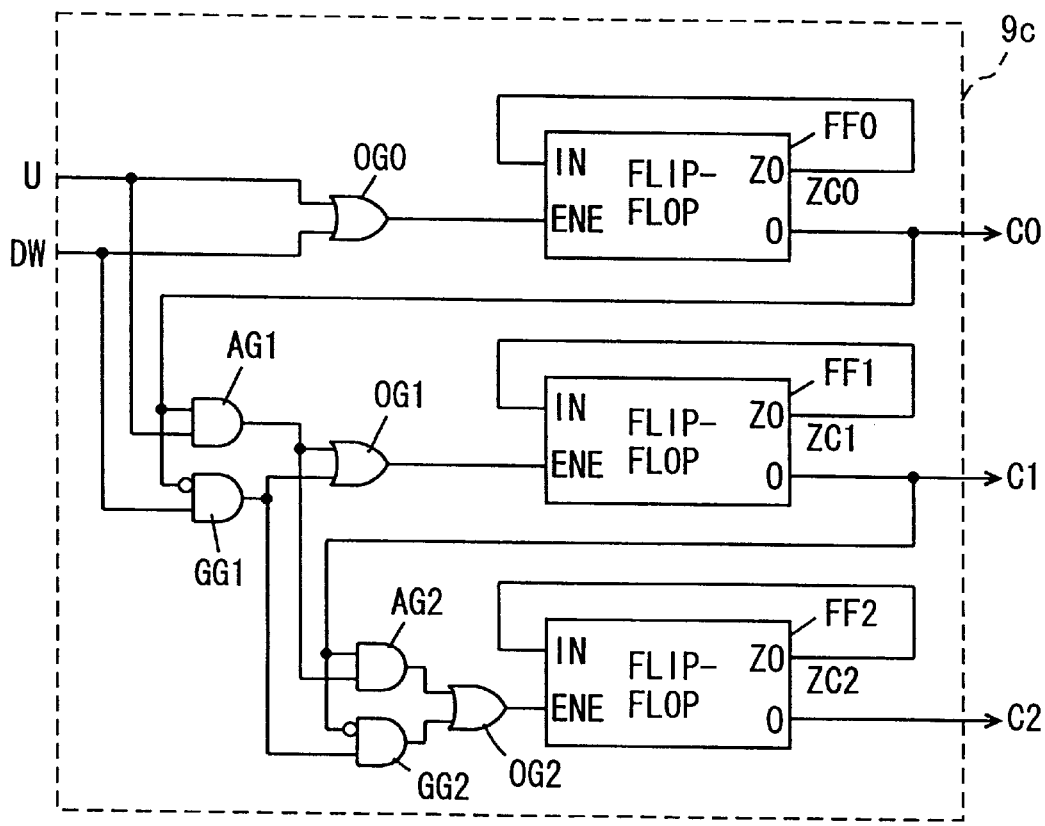
FIG. 5 is a diagram showing an example of a specific configuration of the up/down counter circuit shown in FIG. 4.

FIG. 5 is a diagram showing an example of a configuration of up/down counter circuit 9c shown in FIG. 4. Up/down counter circuit 9c shown in FIG. 5 is a 3-bit counter. This configuration can be extended to a general N-bit up/down counter.

Referring to FIG. 5, up/down counter circuit 9c includes: an OR circuit OG0 receiving signals at up input U and down input DW; a flip-flop FF0 inverting its output count bit C0 when an output signal of OR circuit OG0 is at an H level; an AND circuit AG1 receiving output count bit C0 of flip-flop FF0 and the signal at up input U; a gate circuit GG1 receiving output count bit C0 of flip-flop FF0 and the signal at down input DW; an OR circuit OG1 receiving an output signal of AND circuit AG1 and an output signal of gate circuit GG1; a flip-flop FF1 inverting its output count bit C1 when an output signal of OR circuit OG1 is at an H level; an AND circuit AG2 receiving output count bit C1 of flip-flop FF1 and the output signal of AND circuit AG1; a gate circuit GG2 receiving output count bit C1 of flip-flop FF1 and the output signal of gate circuit GG1; an OR circuit OG2 receiving an output signal of AND circuit AG2 and an output signal of gate circuit GG2; and a flip-flop FF2 inverting its output count bit C2 when an output signal of OR circuit OG2 is at an H level.

Each of flip-flops FF0–FF2 is formed, for example, of a JK flip-flop or a D flip-flop, and when a signal received at its enable input ENE attains an H level, it takes in an output count bit from its output Z0 to its input IN for output from its output O.

Gate circuit GG1 outputs a signal at an H level when count bit C0 is at an L level ("0") and the signal at down input DW is at an H level. Gate circuit GG2 outputs a signal of an H level when count bit C1 is at an L level and an output signal of gate circuit GG1 is at an H level.

To extend 3-bit up/down counter circuit 9c as shown in FIG. 5 to an N-bit up/down counter circuit, it is only required to add a set consisting of AND circuit AG, gate circuit GG and OR circuit OG, and a flip-flop corresponding to the output of the set successively.

The operation of up/down counter circuit 9c shown in FIG. 5 will now be described with reference to the timing chart shown in FIG. 6.

Each of flip-flops FF0 to FF2 is an up-edge type flip-flop, in which a state of the signal from its output O is determined at a timing when the signal applied to its input ENE rises to an H level.

Now, assume that count bits C0 to C2 are all reset to "0" (of an L level). In cycle #1, when a signal of an H level is applied to up input U, the output signal of OR circuit OG0 attains an H level, and output count bit C0 of flip-flop FF0 is inverted to "1". The output signal of AND circuit AG1 is at an L level because the count up designating signal is applied to up input U while count bit C0 is at the L level. Count bit C1 of flip-flop FF1 thus remains unchanged at "0". Similarly, as the output signal of AND circuit AG1 is at the L level and the output signal of AND circuit AG2 is at the L level, output count bit C2 of flip-flop FF2 also remains unchanged.

Next, in cycle #2, the count up designating signal is applied again. Output count bit C0 of flip-flop FF0 changes to "0" according to the output signal of OR circuit OG0. At this time, the count up designating signal is applied while output count bit C0 is at an H level (of "1"). The output signal of AND circuit AG1 thus attains an H level, and in response, the output signal of OR circuit OG1 attains an H level. The state of output count bit C1 of flip-flop FF1 changes to "1". As the output signal of AND circuit AG1 rises to the H level while count bit C1 is at an L level (of "0"), the output signal of AND circuit AG2 is at the L level, and the state of output count bit C2 of flip-flop FF2 remains unchanged.

In cycle #3, the count up designating signal is again applied to up input U, and the state of output count bit C0 from flip-flop FF0 changes to "1" again. As the count up designating signal is applied while count bit C0 is at "0", the output signal of AND circuit AG1 is at the L level, and the state of output count bit C1 from flip-flop FF1 remains unchanged. As the output signal of AND circuit AG1 is at the L level, the output signal of AND circuit AG2 is also at the L level, and thus, count bit C2 from flip-flop FF2 also remains unchanged.

In cycle #4, the count up designating signal is again applied to up input U. Count bit C0 from flip-flop FF0 thus changes to "0". As the count up designating signal is supplied while count bit C0 is at the H level, the output signal of AND circuit AG1 attains the H level, and in response, the state of output count bit C1 from flip-flop FF1 changes. At this time, the output signal of AND circuit AG1 attains the H level when count bit C1 is at the H level, and in response, the output signal of AND circuit AG2 attains an H level and output count bit C2 from flip-flop FF2 changes to "1".

In cycle #5, the count up designating signal is again applied. Count bit C0 from flip-flop FF0 changes to "1". As the count up designating signal is applied when count bit C0 is at the L level, the output signal of AND circuit AG1 maintains the L level. In response, the state of count bit C1 remains unchanged, and the state of count bit C2 also remains unchanged.

In cycle #6, a count down designating signal is applied to down input DW. In response, count bit C0 from flip-flop FF0 first changes to "0". As count bit C0 is at the H level when this count down designating signal is supplied, the output signal of gate circuit GG1 maintains the L level, and the states of count bits C1 and C2 remain unchanged.

In cycle #7, the count up designating signal is again applied to up input U. In response, count bit C0 from flip-flop FF0 changes to "1" according to the output signal of OR circuit OG0. As the count up designating signal is applied when count bit C0 is at "0", the output signals of AND circuits AG1 and AG2 maintain the L level, and the states of count bits C1 and C2 from flip-flops FF1 and FF2 remain unchanged.

In cycle #8, the count down designating signal is again applied to down input DW. Count bit C0 from flip-flop FF0 changes to "0". As the count down designating signal is applied when count bit C0 is at the H level. Thus, the output signals of gate circuits GG1 and GG2 maintain the L level, and the states of count bits C1 and C2 from flip-flops FF1 and FF2 remain unchanged.

In clock cycle #9, the count down designating signal is applied to down input DW again. Count bit C0 of flip-flop FF0 changes to "1". As the count down designating signal is supplied when count bit C0 is at the L level, the output signal of gate circuit GG1 attains the H level, and in response, output count bit C1 from flip-flop FF1 changes from "0" to "1". At this time, as the output signal of gate circuit GG1 attains the H level when count bit C1 is at the L level, gate circuit GG2 generates an output signal at the H level, and the state of count bit C2 from flip-flop FF2 changes to "0".

Figure 6:
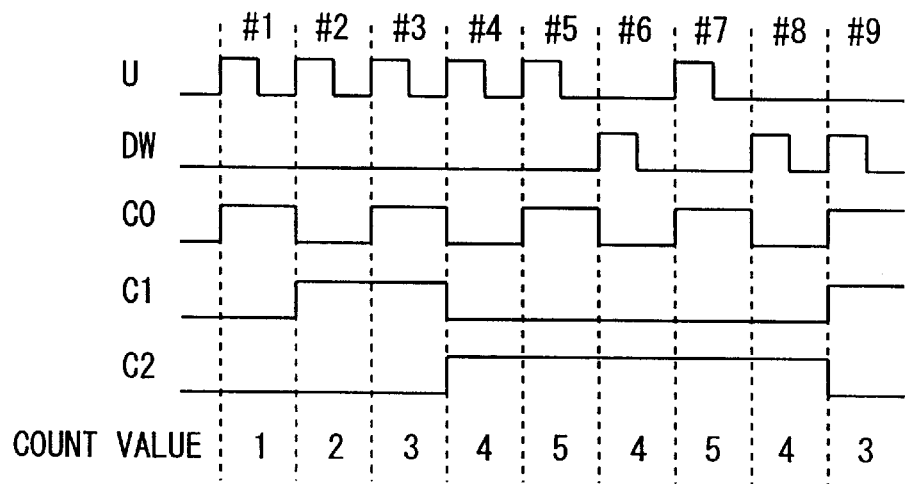
FIG. 6 is a timing chart representing an operation of the up/down counter circuit shown in FIG. 5.

Thus, as seen from the count values shown along the bottom of FIG. 6, the count value is incremented by 1 every time the count-up is designated, and decremented by 1 every time the count-down is designated. Thus, it is possible to perform count-up and count-down operations by the count-up and count-down designations.

The configuration of the up/down counter circuit shown in FIG. 5 may be replaced by another configuration, e.g., a shift register. When utilizing the shift register, an output node to attain an active state shifts upward and downward by one stage according to the up and down designations, respectively. The delay amount of variable delay line 12 is determined according to the output of the shift register.

Figure 7:
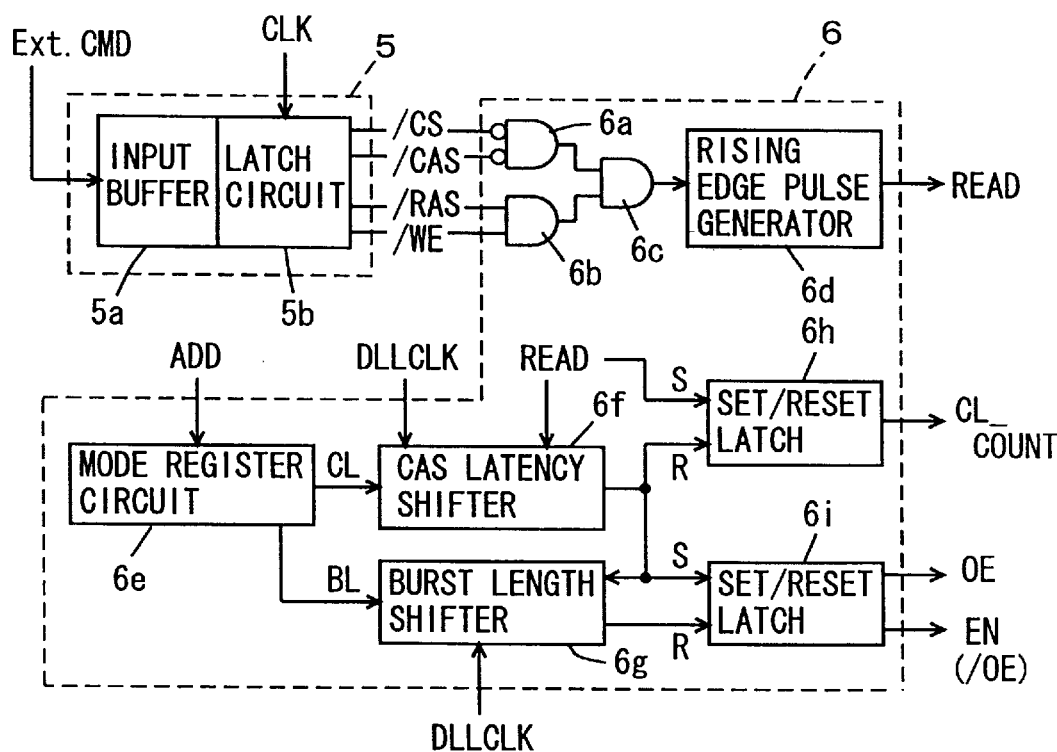
FIG. 7 is a diagram schematically showing configurations of portions related to an activation control signal of a command buffer and a control circuit shown in FIG. 1.

FIG. 7 is a diagram schematically showing configurations of portions related to output control in command buffer 5 and control circuit 6 shown in FIG. 1.

Referring to FIG. 7, command buffer 5 includes: an input buffer 5a receiving an externally supplied command Ext.CMD; and a latch circuit 5b that latches an internal command CMD from input buffer 5a in synchronization with internal clock signal CLK. Latch circuit 5b takes in and latches a signal provided from input buffer 5a, at a rising edge of internal clock signal CLK from clock buffer 3 shown in FIG. 1. Therefore, latch circuit 5b outputs chip select signal /CS, column address strobe signal /CAS, row address strobe signal /RAS and write enable signal /WE in the states at the rising edge of internal clock signal CLK.

Control circuit 6 includes: an NOR circuit 6a receiving chip select signal /CS and column address strobe signal /CAS from latch circuit 5b; an AND circuit 6b receiving row address strobe signal /RAS and write enable signal /WE from latch circuit 5b; an AND circuit 6c receiving an output signal of NOR circuit 6a and an output signal of AND circuit 6b; and a rising edge pulse generator 6d responsive to the rising of an output signal of AND circuit 6c for generating a one-shot pulse signal. Rising edge pulse generator 6d generates a read operation designating signal READ to designate a read operating mode.

NOR circuit 6a outputs a signal at an H level when chip select signal /CS and column address strobe signal /CAS are both at an L level. AND circuit 6b outputs a signal at an H level when row address strobe signal /RAS and write enable signal /WE are both at an H level. Therefore, the read command designating the data read mode is provided by setting both chip select signal /CS and column address strobe signal /CAS to an L level at the rising edge of external clock signal Ext.CLK while setting both row address strobe signal /RAS and write enable signal /WE to an H level at the rising edge of external clock signal Ext.CLK. When this read command is provided, rising edge pulse generator 6d generates a one-shot read operation designating signal READ.

Control circuit 6 further includes: a mode register circuit 6e that is activated in a mode register setting mode for receiving a specific address signal bit ADD to store CAS latency data CL and burst length data BL; a CAS latency shifter 6f for shifting read operation designating signal READ by a CAS latency period according to column latency data CL from mode register circuit 6e in accordance with internal clock signal DLLCLK; a burst length shifter 6g for further shifting an output signal of CAS latency shifter 6f by a period represented by burst length data BL from mode register circuit 6e in accordance with outputting internal clock signal DLLCLK; a set/reset latch 6h that is set when read operation designating signal READ is generated (activated) and is reset when an output signal of CAS latency shifter 6f is activated; and a set/reset latch 6i that is set when the output signal of CAS latency shifter 6f is activated and is reset when an output signal of burst length shifter 6g is activated.

Set/reset latch 6h outputs a column latency signal CL-COUNT that determines a CAS latency period. Set/reset latch 6i outputs output enable signal OE and activation control signal EN. The CAS latency (column latency) indicates the number of clock cycles required from the time when a read command is provided until the time when valid data is output. The burst length indicates the number of pieces of data successively output when the read command is supplied. CAS latency shifter 6f shifts read operation designating signal READ in synchronization with outputting clock signal DLLCLK, and drives its output signal to an active state after a lapse of CAS latency—0.5 cycle period.

Burst length shifter 6g further shifts the output signal of CAS latency shifter 6f by the burst length period in accordance with outputting clock signal DLLCLK. CAS latency shifter 6f determines a time period that is required until a memory cell is selected in the memory cell array, data are amplified by main amplifier circuit MA and read data are latched into parallel/serial conversion circuit 4a (see FIG. 1). Data/strobe output buffer 4b can output valid data after the time period defined by CAS latency shifter 6f has passed, when output enable signal OE is activated and maintained in the active state for a burst time period.

Here, CAS latency shifter 6f and burst length shifter 6g are configured with circuits which shift read operation designating signal READ and the output signal of CAS latency shifter 6f, respectively, in accordance with outputting internal clock signal DLLCLK. Now, an operation of the control circuit shown in FIG. 7 will be described with reference to a timing chart shown in FIG. 8.

In cycle #1 of external clock signal Ext.CLK, a read command is provided. According to this read command, rising edge pulse generator 6d shown in FIG. 7 generates a one-shot read operation designating signal READ. CAS latency shifter 6f takes in this read operation designating signal READ at the falling edge of outputting internal clock signal DLLCLK, and shifts the signal READ by the time period defined by CAS latency data CL (i.e., CAS latency—0.5 cycle). At the generation of this read operation designating signal READ, set/reset latch 6h is set and column latency signal CL-COUNT attains an active state.

Figure 8:
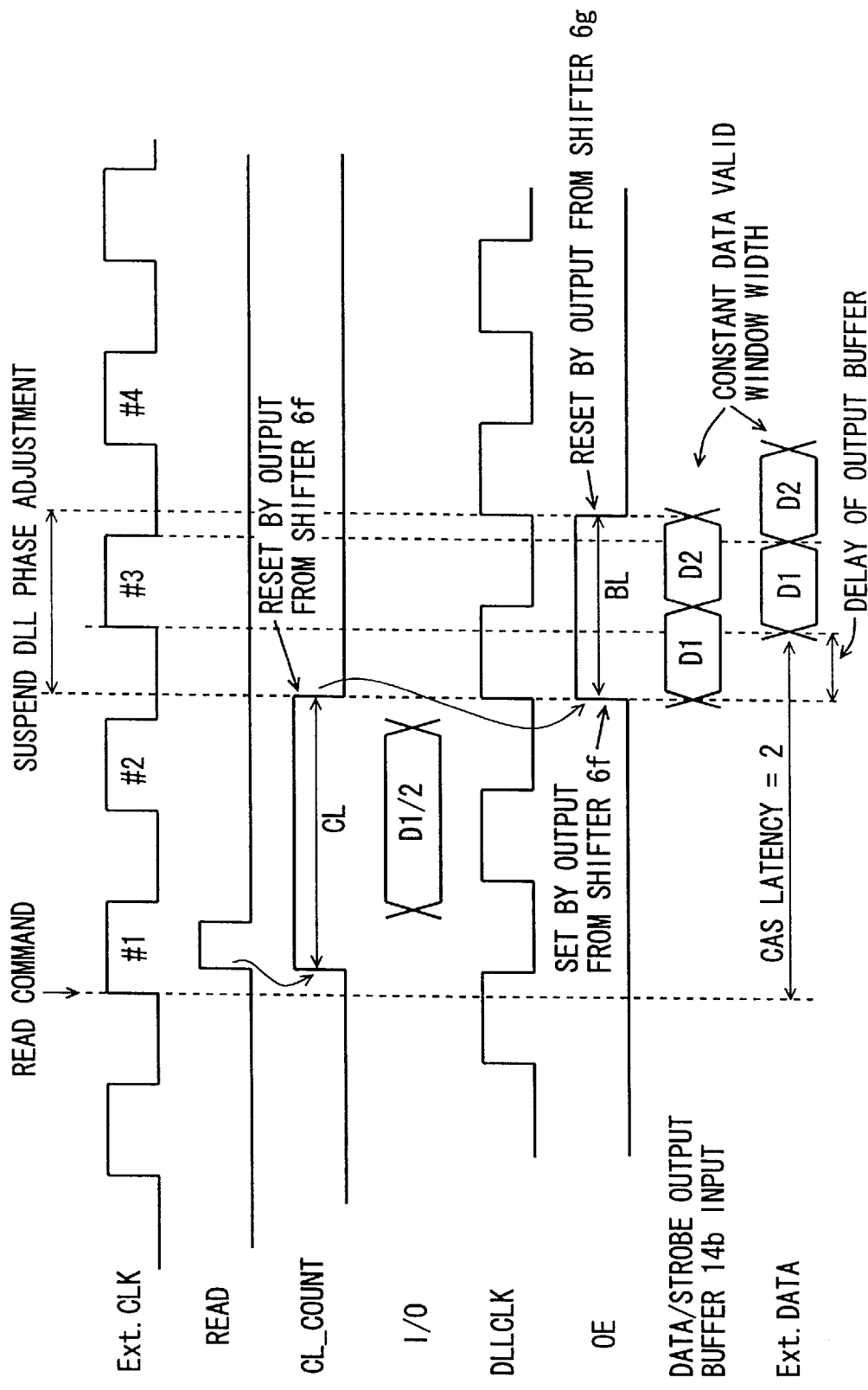
FIG. 8 is a timing chart representing an operation of a semiconductor device according to a first embodiment of the present invention.

The column select operation in the memory cell array is performed in the time period in which column latency signal CL-COUNT is in an active state. Data in the memory cells corresponding to addressed columns (latched at the sense amplifiers) are read out onto internal data lines I/O. In this semiconductor device, data are read out according to a 2-bit prefetch scheme, in which data of two bits are read out parallel per data output terminal. Thus, two bits of data D1 and D2 (D1/D2) are transmitted onto internal data lines I/O. Data D1 and D2 read out onto internal data lines I/O are amplified by main amplifier circuit MA shown in FIG. 1, and latched into parallel/serial conversion circuit 4a. Normally, the timing of activation of main amplifier circuit MA is also determined according to the CAS latency (i.e., CAS latency—1 cycle period). FIG. 8 shows, by way of example, a data read operation in the case where the CAS latency is 2.

When storing of data into the parallel/serial conversion circuit is completed, CAS latency shifter 6a shown in FIG. 7 completes the shifting operation, and its output signal attains an active state. Set/reset latch 6h is reset, and column latency signal CL-COUNT attains an inactive state at an L level. According to the inactivation of column latency signal CL-COUNT, i.e., according to activation of the output signal of CAS latency shifter 6a, set/reset latch 6i is set, output enable signal OE attains an active state, and activation control signal EN attains an inactive state at an L level.

Therefore, in cycle #2 of external clock signal Ext.CLK, when outputting internal clock signal DLLCLK rises to an H level, output enable signal OE is activated, and the DLL circuit suspends its phase adjusting operation. When this output enable signal OE is activated, parallel/serial conversion circuit 4a shown in FIG. 1 transfers data successively in accordance with outputting internal clock signal DLLCLK, and data/strobe output buffer 14b also takes in and transfers data according to outputting internal clock signal DLLCLK. External data Ext.DATA are output after a lapse of a delay time in data/strobe output buffer 14b.

As long as the DLL circuit is accurately performing the phase adjusting operation, external data Ext.DATA are in phase-synchronization with external clock signal Ext.CLK. At this time, a strobe signal (not shown) is also in phase-synchronization with external clock signal Ext.CLK. Output enable signal OE is in an active state while data D1 and D2 are output, and the phase adjusting operation of the DLL circuit is suspended. The phase relation between outputting internal clock signal DLLCLK and external clock signal Ext.CLK is maintained which was immediately before the data output. Therefore, a constant data valid window width is maintained, and no edge-to-edge jitter is generated.

After a lapse of the time period defined by burst length data BL (the burst length of 2 in the case of FIG. 8), the output signal of burst length shifter 6e shown in FIG. 7 is activated. Set/reset latch 6a is reset, output enable signal OE attains an inactive state, and activation control signal EN is activated. The DLL circuit resumes the phase adjusting operation. Therefore, by utilizing output enable signal OE, it is possible to prevent, with accuracy, generation of jitter-in outputting internal clock signal DLLCLK during the time period in which data are externally output.

In the configuration shown in FIG. 7, resetting of set/reset latch 6h and setting of set/reset latch 6i are performed in accordance with the output signal of CAS latency shifter 6f. However, set/reset latch 6i may be set in response to inactivation of column latency signal CL-COUNT.

First Modification

Figure 9:
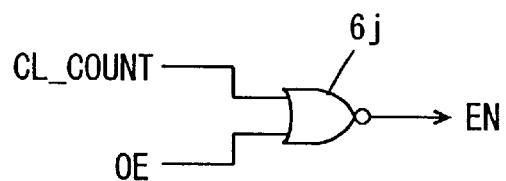
FIG. 9 is a diagram schematically showing a configuration of a first modification of the first embodiment of the present invention.

FIG. 9 is a diagram schematically showing a configuration of a first modification of the first embodiment of the present invention. In the configuration shown in FIG. 9, an NOR circuit 6j receives column latency signal CL-COUNT and output enable signal OE, and outputs activation control signal EN. If the configuration shown in FIG. 9 is utilized, during a time period from activation of read operation designating signal READ until completion of output of data D1 and D2 as shown in FIG. 8, activation control signal EN attains an inactive state and the DLL circuit suspends the phase adjusting operation. With the configuration shown in FIG. 9 being utilized, in an internal data reading, CAS latency shifter 6f and burst length shifter 6g perform shifting operations according to clock signal DLLCLK, and output enable signal OE can be activated precisely after data amplified by main amplifier circuit MA have been stored in parallel/serial conversion circuit 4a. Accordingly, the adverse effects of edge-to-edge jitter in outputting internal clock signal DLLCLK on the internal read data transferring operation can be eliminated, and accurate data reading can be achieved (the time period until selected memory cell data reach main amplifier circuit MA is constant regardless of the frequency of the clock signal).

Second Modification

Figure 10A:
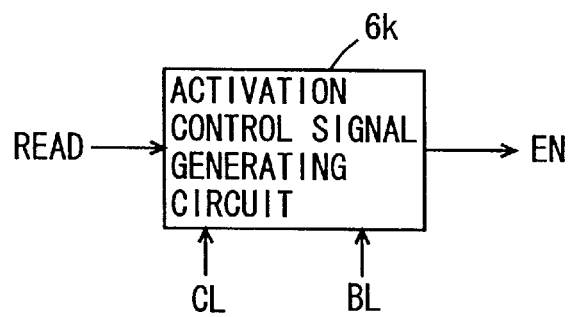
FIG. 10A schematically shows a configuration of a second modification of the first embodiment of the present invention.

FIG. 10A is a diagram schematically showing a configuration of a second modification of the first embodiment of the present invention. In the configuration shown in FIG. 10A, in response to activation of read operation designating signal READ, activation control signal EN from an activation control signal generating circuit 6k is held in an inactive state for the time period defined by CAS latency data CL and burst length data BL. Activation control signal generating circuit 6k holds activation control signal EN in the inactive state for an appropriate time period including the time period during which output enable signal OE is held in an active state.

Figure 10B:
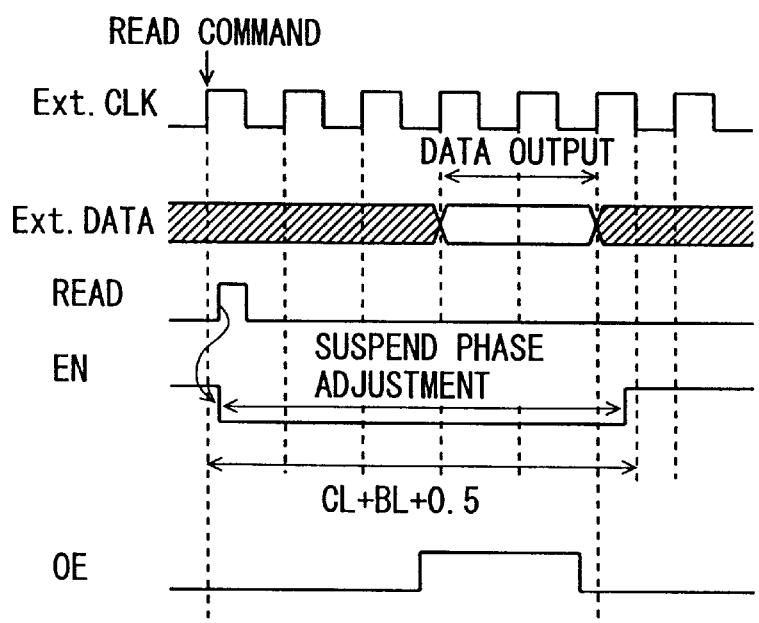
FIG. 10B is a timing chart representing an operation of the circuit shown in FIG. 10A.

FIG. 10B is a timing chart illustrating an operation of activation control signal generating circuit 6k shown in FIG. 10A. As shown in FIG. 10B, activation control signal generating circuit 6k drives activation control signal EN to the inactive state when read operation designating signal READ is activated. This activation control signal EN is held in the inactive state for a time period in which output enable signal OE is activated and external data Ext.DATA are output, and further for a half clock cycle (of the external clock signal). In other words, activation control signal EN is held in the inactive state for the CAS latency period+burst length period+0.5 cycle period of the external clock signal. In this case, activation control signal EN is driven to an active state to enable the DLL circuit to perform the phase adjusting operation only after all the data are completely output and valid data are allowed to enter an uncertain state. Therefore, it is possible to accurately maintain a constant data valid window width even for the final output data.

What is necessary is that, when a read command is provided, activation control signal EN is held in the inactive state for an appropriate proper time period including the period in which output enable signal OE is in an active state (i.e., for a time period by which the effects of edge-to-edge jitter on the data valid window can be prevented) in accordance with the column latency data and the burst length data. Accordingly, activation control signal EN may be held in the inactive state, for example, during a time period from the time preceding by a half cycle the activation of output enable signal OE until the lapse of a half cycle after inactivation of output enable signal OE.

In the first embodiment, the DLL circuit is used as the internal clock generating circuit. However, any of clock synchronization circuits for generating a signal in phase-synchronization with an external clock signal, such as a phase locked loop (PLL) circuit and a symmetrical mirror delay (SMD) circuit, may be used to accurately suppress the effects of edge-to-edge jitter on the valid window of output data, by causing its phase adjusting operation to be suspended.

Second Embodiment

Figure 11A:
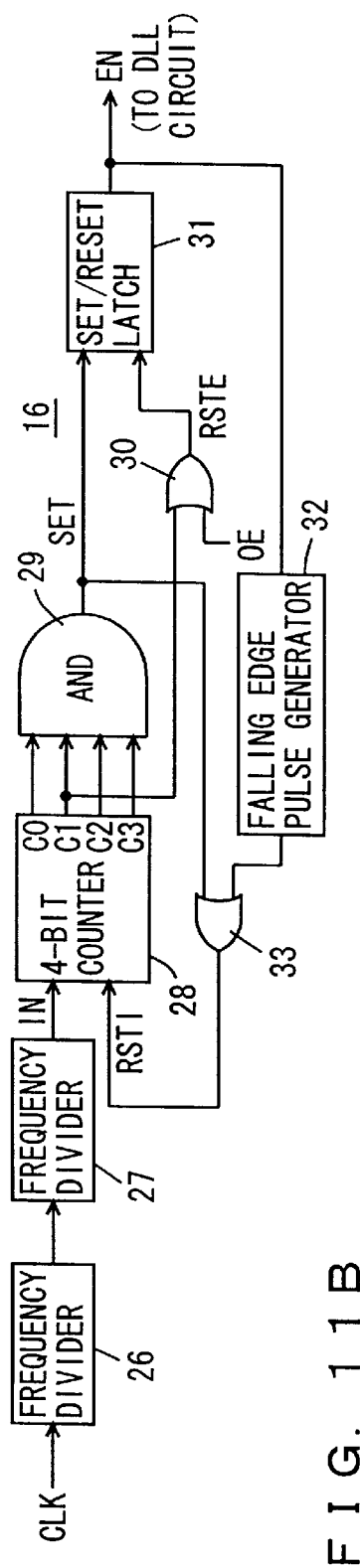
FIG. 11A is a diagram schematically showing a configuration of a main portion of a semiconductor device according to a second embodiment of the present invention.

FIG. 11A is a diagram schematically showing a configuration of a main portion of a semiconductor device according to the second embodiment of the present invention. Specifically, FIG. 11A shows a configuration of a portion provided in the control circuit on the semiconductor device, for generating of activation control signal EN. Referring to FIG. 11A, the activation control signal generating portion includes: a frequency divider 26 for dividing the frequency of internal clock signal CLK by a factor of 2; a frequency divider 27 for further dividing the frequency of an output clock signal from divider 26 by a factor of 2; a 4-bit counter 28 for counting an output signal of frequency divider 27; an AND circuit 29 receiving output count bits C0 to C3 from 4-bit counter 28 in parallel; an OR circuit 30 receiving output count bit C1 from 4-bit counter 28 and output enable signal OE; a set/reset latch (flip-flop) 31 that is set in response to activation of an output signal SET from AND circuit 29 and reset in response to activation of an output signal RSTE of OR circuit 30; a falling edge pulse generator 32 responsive to falling (inactivation) of activation control signal EN output from set/reset latch 31 for generating a one-shot pulse signal; and an OR circuit 33 receiving output signal SET of AND circuit 29 and an output pulse signal from falling edge pulse generator 32.

Figure 11B:
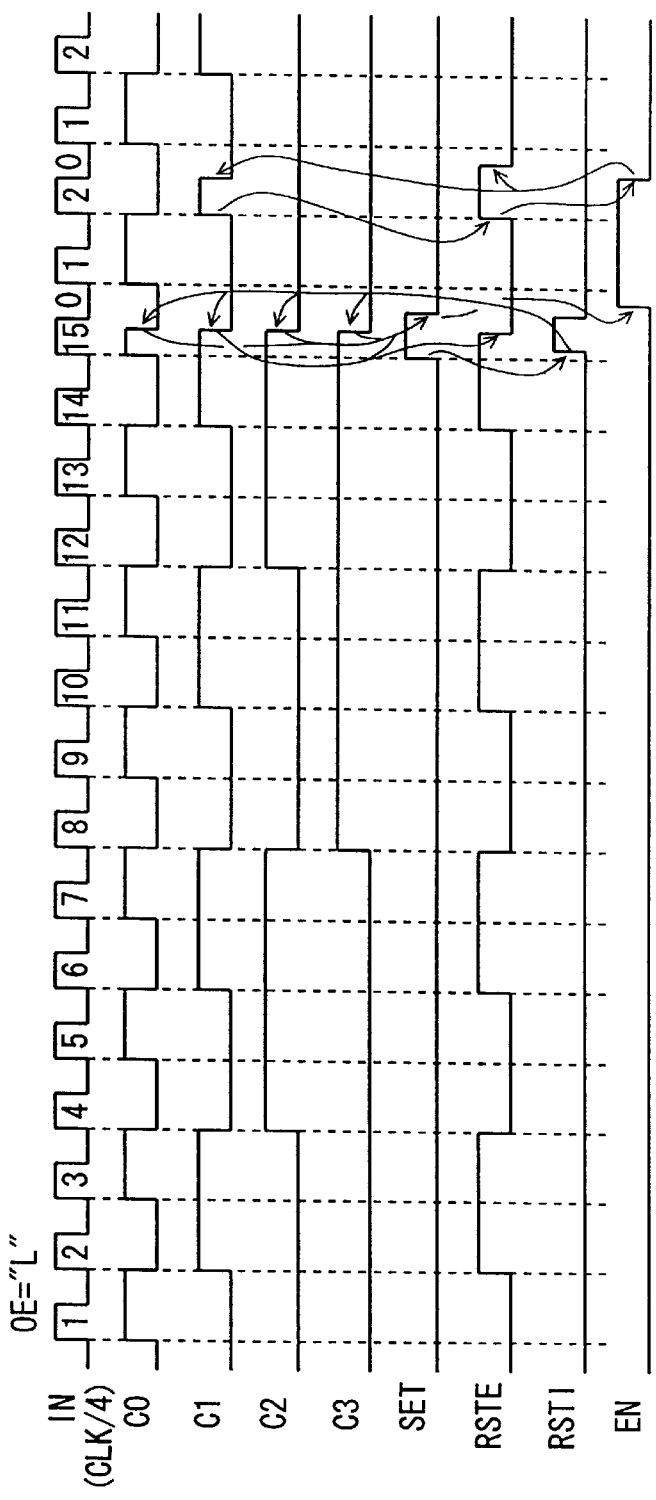
FIG. 11B is a timing chart representing an operation of the circuit shown in FIG. 11A.

The count value of 4-bit counter 28 is reset to "0000" in accordance with an output signal RSTI of OR circuit 33. Now, an operation of the activation control signal generating portion shown in FIG. 11A will be described with reference to a timing chart shown in FIG. 11B.

Frequency dividers 26 and 27 each divide internal clock signal CLK by a factor of 2. Therefore, the output signal IN of the divider 27 is a quad-divided clock signal of internal clock signal CLK, having a period four times that of internal clock signal CLK. 4-bit counter 28 counts this output signal IN of the divider 27. Now, assume that output enable signal OE is in an inactive state at an L level. In this case, every time count bit C1 of 4-bit counter 28 rises to an H level, OR circuit 30 causes output signal RSTE to rise to an H level, to reset set/reset latch 31. As output enable signal OE is in the inactive state at the L level, output activation control signal EN maintains the L level.

When the count value of 4-bit counter 28 reaches 15, output count bits C0–C3 all attain the H level. Thus, output signal SET of AND circuit 29 attains the H level, and set/reset latch 31 is set. At this time, reset signal RSTE from OR circuit 30 also attains the H level. In contrast, output signal RSTI of OR circuit 33 attains the H level according to output signal SET of AND circuit 29, and count bits C0 to C3 of 4-bit counter 28 are all reset to "0". In response, output signal RSTE of OR circuit 30 attains an L level, and then, output signal SET of AND circuit 29 attains an L level. Set/reset latch 31 is set in response to the H level of output signal SET of AND circuit 29, and drives output activation control signal EN to the H level.

Four-bit counter 28 further performs the counting operation. When the count value becomes 2, output count bit Cl attains an H level, output signal RSTE from OR circuit 30 attains the H level, and set/reset latch 31 is reset. Thus, activation control signal EN is driven to an inactive state at the L level. In response to the inactivation of activation control signal EN, a one-shot pulse signal is output from falling edge pulse generator 32, and output signal RSTI from OR circuit 33 is activated. The count value of 4-bit counter 28 is reset to "0" again. Thereafter, the operation of counting output clock signal IN of frequency divider 27 is continued.

As explained above, when the count value reaches the greatest count value of 15, activation control signal EN is held in the active state at the H level for 2 clock cycles of the divider 27. Accordingly, activation control signal EN is held in the active state of the H level for 8 cycles out of 60 cycles of internal clock signal CLK.

By utilizing frequency dividers 26 and 27, count values for counting an activated period of activation control signal EN can be kept small. In response, the configuration of 4-bit counter 28 can be made small in size. Normally, how often a delay amount is incremented/decremented in a DLL circuit is determined based on a time-dependent varying rate (varying rate over time) of DLL clock signal DLLCLK and a time-varying rate of external clock signal Ext.CLK, that are derived from operating condition, such as operating temperature and operating voltage, of the semiconductor device incorporating the DLL circuit. When the time-dependent rate of the operating condition of the system is small, the time-dependent rate of DLL clock signal DLLCLK is also small. Thus, it is possible to ensure that clock signal DLLCLK output from the DLL circuit has a constant phase difference relative to external clock signal Ext.CLK even when the frequency of increment/decrement of the delay amount in the DLL circuit is low. Conversely, if the time-dependent rate of the operating condition of the system is large, the time-dependent rate of DLL signal DLLCLK is large correspondingly. Therefore, it is necessary to frequently increment/decrement the delay amount in the DLL circuit such that clock signal DLLCLK output from the DLL circuit can follow external clock signal Ext.CLK. By utilizing the configuration shown in FIG. 11A, it is possible to limit the delay amount adjusting period of the DLL circuit to a minimal necessary period. Thus, the edge-to-edge jitter in the internal clock signal can be suppressed, while current consumption can be reduced.

While output enable signal OE is at the H level, output signal RSTE of OR circuit 30 attains an H level, set/reset latch 31 is reset, and thus, output activation control signal EN attains an inactive state. During this time period, the DLL circuit suspends its phase adjusting operation.

Accordingly, it is possible to reduce the current consumption of the DLL circuit while suppressing the variation of data valid window width during the transfer of output data.

First Modification

Figure 12:
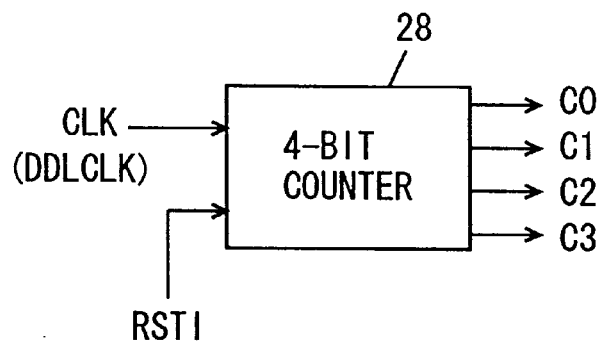
FIG. 12 is a diagram schematically showing a configuration of a first modification of the second embodiment of the present invention.

FIG. 12 is a diagram schematically showing a configuration of a first modification of the second embodiment of the present invention. Referring to FIG. 12, 4-bit counter 28 is provided with internal clock signal CLK or outputting internal clock signal DLLCLK from the DLL circuit. Output count bits C0 to C3 from 4-bit counter 28 are applied to AND circuit 29 shown in FIG. 11A, and count bit C1 is applied to OR circuit 30. Otherwise, the configuration shown in FIG. 12 is the same as that shown in FIG. 11A.

In the configuration shown in FIG. 12, internal clock signal CLK or DLLCLK has a clock cycle that is equal to the clock cycle of external clock signal Ext.CLK. Therefore, it is possible to control the phase adjusting operation of the DLL circuit in accordance with the cycle of the external clock signal. That is, the operation of the internal DLL circuit can be controlled in accordance with an external operation. Specifically, it is possible to accurately control the operation of the DLL circuit in accordance with the burst period and the CAS latency period.

Second Modification

Figure 13:
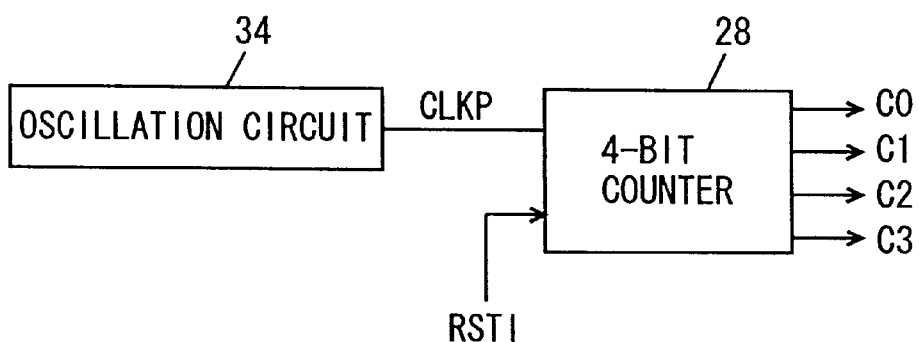
FIG. 13 is a diagram schematically showing a configuration of a second modification of the second embodiment of the present invention.

FIG. 13 is a diagram schematically showing a configuration of a second modification of the second embodiment of the present invention. In the configuration shown in FIG. 13, an oscillation clock signal CLKP from an oscillation circuit 34 formed, for example, of a ring oscillator, is applied to a count input of 4-bit counter 28. Otherwise, the configuration of FIG. 13 is identical to that of FIG. 11A.

Oscillation circuit 34 performs the oscillating operation at a prescribed period, to generate oscillation clock signal CLKP having a clock period independent of the external clock signal. Activation control signal EN is controlled with a period of oscillation clock signal CLKP that is independent of the external clock signal. Thus, the phase adjusting operation of the DLL circuit can be controlled taking into consideration an operation parameter of the semiconductor device, e.g., stability of the DLL circuit. Accordingly, it is possible to control the phase adjusting operation of the DLL circuit in accordance with the practical performance of the semiconductor device.

Furthermore, extending the oscillation period of oscillation circuit 34 permits smaller count values to be used in a counter for detecting the period of suspension of the phase adjusting operation of the DLL circuit. Thus, the circuit configuration of the counter can be made small.

Third Modification

Figure 14:
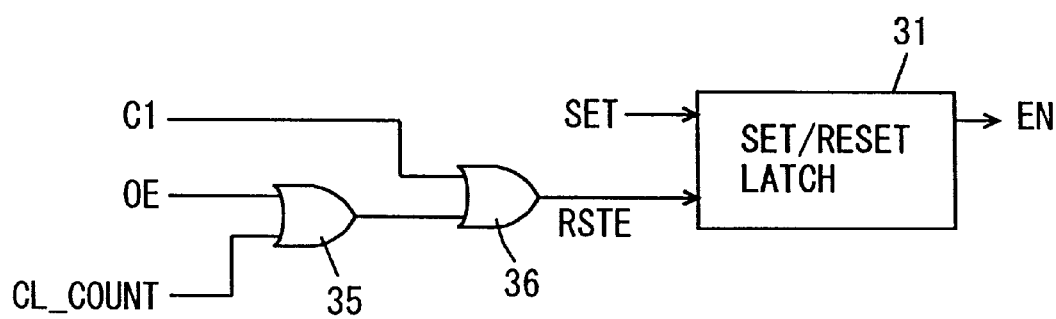
FIG. 14 is a diagram schematically showing a configuration of a third modification of the second embodiment of the present invention.

FIG. 14 is a diagram showing a configuration of a modification of the semiconductor device according to the second embodiment of the present invention. In FIG. 14, an OR circuit 35 receiving output enable signal OE and column latency signal CL-COUNT and an OR circuit 36 receiving an output signal of OR circuit 35 and count bit C1 from 4-bit counter 28 shown in FIG. 11A are provided for reset of set/reset latch 31 that is set in response to output signal SET from AND circuit 29 shown in FIG. 11A to generate activation control signal EN. OR circuit 36 outputs a signal RSTE for resetting set/rest latch 31.

In the configuration shown in FIG. 14, when the read command is provided, activation control signal EN is inactivated during a time period in which internal data are being read. Thus, at the time of burst counting operation for generation of a burst address, it is possible to further prevent variation of a burst address valid period. In addition, when the internal read data are transferred in synchronization with a clock signal, it is possible to set a constant time period for the internal read data transfer at each cycle.

Though 4-bit counter 28 is used in the second embodiment, the number of bits of this counter is arbitrary. Thus, a general N-bit counter can be utilized instead.

Moreover, in the configuration shown in FIG. 14, it is possible to cause activation control signal EN to be is inactivated during a time period from application of the read command until the completion of data output, as shown in FIG. 11A.

As explained above, according to the second embodiment of the present invention, the phase adjusting operation of the DLL circuit is activated periodically, so that this phase adjusting operation of the DLL circuit can be performed in accordance with the operating environment. Accordingly, it is possible to suppress the edge-to-edge jitter in the internal clock signal without increasing the current consumption.

Third Embodiment

Figure 15:
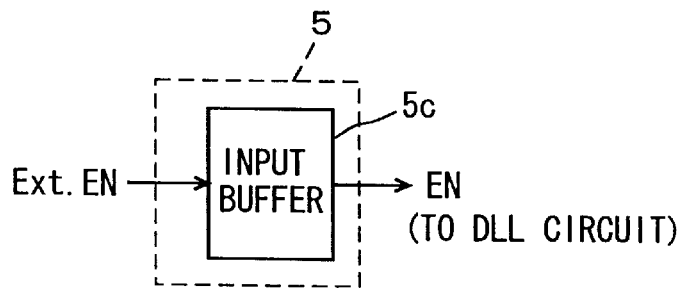
FIG. 15 is a diagram schematically showing a configuration of a main portion of a semiconductor device according to a third embodiment of the present invention.

FIG. 15 is a diagram schematically showing a configuration of a main portion of a semiconductor device according to the third embodiment of the present invention. The command buffer 5 shown in FIG. 15 includes an input buffer 5c for buffering externally supplied activation control signal Ext.EN to generate internal activation control signal EN. This internal activation control signal EN from input buffer 5c is applied to the DLL circuit and used to control the phase adjusting operation therein.

An externally provided processor is able to know the time period in which data are read out from the semiconductor device in advance (when a read command is applied). Therefore, external activation control signal Ext.EN can be externally driven to an inactive state for a prescribed time period in accordance with the read command, so that the operation of the DLL circuit can be controlled with accuracy according to the data reading.

In the case where external activation control signal Ext.EN is provided, the phase adjusting operation at the DLL circuit can be suspended (or, the clock generating operation itself can be suspended) while there is no access to the semiconductor device, for example, in a data holding mode including a self refresh mode.

Therefore, by adjusting the phase adjusting operation of the DLL circuit by externally supplying activation control signal Ext.EN via a specific pin terminal, it is possible to control the operation of the DLL circuit readily in conformity with data output.

Also in the case where activation control signal Ext.EN is externally supplied, it is possible to employ a configuration in which a phase difference between external clock signal Ext.CLK and the data strobe signal is detected at an external processor and, according to the detected phase difference, the phase adjustment is carried out in the DLL circuit of the semiconductor device under control of the external processor. It is also possible to control the phase adjusting operation of the DLL circuit in accordance with an actual phase error in outputting internal clock signal DLLCLK of the semiconductor device.

First Modification

Figure 16:
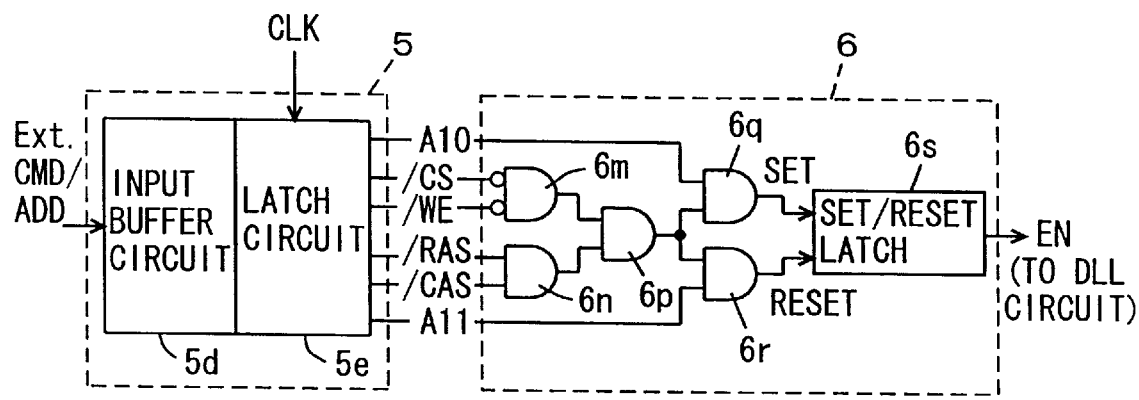
FIG. 16 is a diagram schematically showing a configuration of a first modification of the semiconductor device according to the third embodiment of the present invention.

FIG. 16 is a diagram showing a configuration of a first modification of the third embodiment of the present invention. FIG. 16 also shows a configuration for externally controlling the phase adjusting operation of the DLL circuit. Referring to FIG. 16, command buffer 5 includes: an input buffer circuit 5d receiving externally supplied command Ext.CMD and a specific external address signal bit Ext.ADD; and a latch circuit 5e for latching internal signals from input buffer circuit 5d in synchronization with internal clock signal CLK. Latch circuit 5e outputs address bits A10 and A11, and internal control signals /CS, /WE, /RAS, and /CAS.

Control circuit 6 includes: an NOR circuit 6m receiving chip select signal /CS and write enable signal /WE; an AND circuit 6n receiving row address strobe signal /RAS and column address strobe signal /CAS; an AND circuit 6p receiving output signals from NOR circuit 6m and AND circuit 6n; an AND circuit 6q receiving an output signal from AND circuit 6p and address bit A10; an AND circuit 6r receiving the output signal from AND circuit 6p and address bit A11; and a set/reset latch 6s that is set in response to an output signal SET of AND circuit 6q and is reset in accordance with an output signal RESET of AND circuit 6r. Set/reset latch 6s outputs activation control signal EN for control of the phase adjusting operation of the DLL circuit.

NOR circuit 6m and AND circuits 6n and 6p each output a signal at an H level when chip select signal /CS and write enable signal /WE are at an L level and row address strobe signal /RAS and column address strobe signal /CS are both at an H level. The command at the time when the output signal of AND circuit 6p is at the H level is different from the read command, and also different from a write command for designating a normal data writing or an array activation command for designating a row selecting operation. Activation/inactivation of activation control signal EN is externally controlled utilizing a command dedicated for setting the state of activation control signal EN.

According to the configuration shown in FIG. 16, it is unnecessary to utilize a specific pin for controlling activation control signal EN.

In the configuration shown in FIG. 16, another command may be used as the command for controlling the active/inactive state of activation control signal EN. As the configuration shown in FIG. 16 also permits external control of the phase adjusting operation of the DLL circuit, an external circuit can control the phase adjusting operation of the DLL circuit in accordance with the operation of the semiconductor device, and therefore the phase adjusting operation can be controlled during an arbitrary time period including the period for data output. Further, it is also possible to activate this phase adjusting operation of the DLL circuit at a prescribed period (time interval) under the control of an external processor, as in the case of a refreshing operation.

Second Modification

Figure 17:
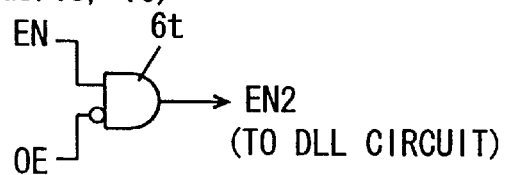
FIG. 17 is a diagram schematically showing a configuration of a second modification of the third embodiment of the present invention.

FIG. 17 is a diagram showing a configuration of a second modification of the third embodiment of the present invention. In the case where activation control signal EN shown in FIGS. 15 and 16 is driven to an active/inactive state independent of output enable signal OE, it is necessary to suspend the phase adjusting operation of the DLL circuit while output enable signal OE is in an active state for data output. Thus, in FIG. 17, a gate circuit 6t is provided which receives activation control signal EN and output enable signal OE and generates an activation control signal EN2 to be applied to the DLL circuit.

Gate circuit 6t operates as a buffer when output enable signal OE is at an L level, and generates activation control signal EN2 to be applied to the DLL circuit according to activation control signal EN generated from the circuit shown in FIG. 15 or FIG. 16. When output enable signal OE attains an active state at the H level, gate circuit 6t drives activation control signal EN2 to be applied to the DLL circuit to an inactive state at the L level to suspend the phase adjusting operation of the DLL circuit, regardless of the state of activation control signal EN received from the circuit shown in FIG. 15 or FIG. 16.

In the configuration shown in FIG. 17, it is also possible to provide gate circuit 6t with a logical sum version of output enable signal OE and column latency signal CL-COUNT.

As explained above, according to the third embodiment of the present invention, the phase adjusting operation of the DLL circuit can be externally controlled. Therefore, it is possible to allow the DLL circuit to perform the phase adjusting operation only when necessary dependent on the operating state of the semiconductor device, and thus, it is possible to suppress occurrence of the edge-to-edge jitter in clock signal DLLCLK output from the DLL circuit.

Further, an external processor is able to control the phase adjusting operation of the DLL circuit of the semiconductor device in accordance with a phase difference between external clock signal Ext.CLK and an inputted data strobe signal (especially at initialization). In this case, the DLL circuit can be made to perform the phase adjusting operation only when required, and thus, it is possible to suppress the occurrence of jitter in clock signal DLLCLK output from the DLL circuit.

Other Applications

In the above description, a semiconductor memory device that outputs data at a double data rate in synchronization with a clock signal is shown as an example of the semiconductor device. However, the present invention is applicable to any device that outputs data in synchronization with a clock signal.

Further, the DLL circuit is used as the internal clock signal generating circuit in the above embodiments. However, the instant invention is applicable to any internal clock signal generating circuit, such as a PLL circuit or an SMD circuit, as long as it is a synchronization circuit that adjusts the phase of the internal clock signal in accordance with the phase difference between the internal clock signal and a reference clock signal.

Further still, the present invention's application is not limited to a dynamic random access memory (DRAM). The present invention is also applicable to a clock synchronous type SRAM or a dock synchronous type flash memory that outputs data in synchronization with a clock signal.

As explained above, according to the present invention, the phase adjusting operation of an internal clock generating circuit is selectively activated. Thus, it is possible to suppress an edge-to-edge jitter in an internal clock signal, and therefore, it is possible to hold a valid period of the internal signal accurately at a prescribed time period.

In particular, by suspending the phase adjusting operation of the internal clock signal at the time of data output, it is possible to maintain a constant data valid window width, whereby high-speed data transfer is implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
an internal clock generating circuit receiving a first clock signal corresponding to an external clock signal, for generating a second clock signal in synchronization with said first clock signal, said internal clock generating circuit including phase adjusting means for detecting a phase difference between the first and second clock signals to adjust the phase of said second clock signal based on a detection result;
an output circuit activated in a data output mode, for externally outputting data in synchronization with said second clock signal; and
a clock control circuit for suspending a phase adjusting operation of said phase adjusting means in said data output mode, at least during a time period in which said output circuit is activated.

2. The semiconductor device according to claim 1, wherein
said internal clock generating circuit includes a variable delay circuit for delaying said first clock signal to generate said second clock signal, said phase adjusting means adjusting a delay time of said variable delay circuit according to said phase difference such that the output data from said output circuit synchronizes in phase with said external clock, and
said clock control circuit suspends an adjusting operation on the delay time of said variable delay circuit.

3. The semiconductor device according to claim 1, further comprising an output control circuit for generating an output enable signal for activating said output circuit in said data output mode, wherein
said clock control circuit includes means for suspending the phase adjusting operation of said phase adjusting means at least during a time period in which said output enable signal is in an active state.

4. The semiconductor device according to claim 1, further comprising:
a plurality of memory cells;
a read circuit for reading data in a memory cell addressed from said plurality of memory cells in said data output mode for transmission to said output circuit;
a latency control circuit responsive to a data read command designating said data output mode for generating a column latency signal defining a timing of activation of an output enable signal for activation of said output circuit; and
an output control circuit responsive to said column latency signal for activating said output enable signal; wherein
said clock control circuit includes means for suspending said phase adjusting operation during a column latency period defined by said column latency signal and during a time period in which said output enable signal is in an active state.

5. The semiconductor device according to claim 1, further comprising an adjustment activating circuit for activating said phase adjusting means at a prescribed period.

6. The semiconductor device according to claim 5, wherein said adjustment activating circuit includes means for activating said phase adjusting means at said prescribed period, in accordance with a clock signal corresponding to said first clock signal.

7. The semiconductor device according to claim 6, wherein the clock signal corresponding to said first clock signal is said external clock signal.

8. The semiconductor device according to claim 6, wherein the clock signal corresponding to said first clock signal is a frequency-divided clock signal of said first clock signal.

9. The semiconductor device according to claim 5, wherein said adjustment activating circuit includes
an oscillation circuit for generating an internal clock signal through an oscillating operation thereof, and
means for activating said phase adjusting means at said prescribed period in accordance with the internal clock signal from said oscillation circuit.

10. The semiconductor device according to claim 1, further comprising an adjustment activating circuit for activating said phase adjusting means in accordance with an externally supplied activation control signal.

11. The semiconductor device according to claim 1, further comprising an adjustment activating circuit for activating said phase adjusting means in accordance with an externally supplied activation control signal and an output enable signal for activating said output circuit.

12. A semiconductor device, comprising:
- a clock generating circuit for generating a first clock signal in synchronization with a second clock signal corresponding to an externally supplied clock signal, said clock generating circuit including phase adjusting means for detecting a phase difference between the first and said second clock signals to adjust a phase of said first clock signal according to a detection result;
- an internal circuit operating in synchronization with said first clock signal; and
- a clock control circuit for activating a phase adjusting operation of said phase adjusting means in response to an activation control signal.

13. The semiconductor device according to claim 12, wherein said clock control circuit includes means for counting a prescribed period in accordance with a clock signal corresponding to said second clock signal to activate said activation control signal according to a count result.

14. The semiconductor device according to claim 13, wherein the clock signal corresponding to said second clock signal is an externally supplied clock signal.

15. The semiconductor device according to claim 13, wherein the clock signal corresponding to said second clock signal is a frequency-divided clock signal of said second clock signal.

16. The semiconductor device according to claim 12, wherein said clock control circuit includes
- an oscillation circuit for generating an internal clock signal through an oscillating operation thereof, and
- means for activating said activation control signal at a prescribed period in accordance with said internal clock signal from said oscillation circuit.

17. The semiconductor device according to claim 12, wherein said clock control circuit includes means for activating said activation control signal in accordance with an externally supplied activation control signal.

* * * * *